US 9,774,247 B2

(12) United States Patent
Sharaf et al.

(10) Patent No.: US 9,774,247 B2
(45) Date of Patent: Sep. 26, 2017

(54) POWER MODULE COOLING SYSTEM

(71) Applicant: Lear Corporation, Southfield, MI (US)

(72) Inventors: Nadir Sharaf, Bloomfield Township, MI (US); Yu Qin, Troy, MI (US); Reshma Rathod, Auburn Hills, MI (US); Richard J. Hampo, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 193 days.

(21) Appl. No.: 14/607,344

(22) Filed: Jan. 28, 2015

(65) Prior Publication Data

US 2015/0138689 A1    May 21, 2015

Related U.S. Application Data

(62) Division of application No. 13/209,552, filed on Aug. 15, 2011, now Pat. No. 9,030,822.

(51) Int. Cl.
*H02M 1/44* (2007.01)
*H01G 4/228* (2006.01)
(Continued)

(52) U.S. Cl.
CPC .............. *H02M 1/44* (2013.01); *H01G 4/228* (2013.01); *H02M 7/003* (2013.01); *H02M 7/493* (2013.01);
(Continued)

(58) Field of Classification Search
CPC ........ H02M 1/44; H02M 7/003; H02M 7/493; H01G 4/228; H05K 7/20927
See application file for complete search history.

(56) References Cited

U.S. PATENT DOCUMENTS 3,604,082 A   9/1971   McBrayer et al.
3,622,846 A   11/1971  Reimers
(Continued)

FOREIGN PATENT DOCUMENTS

CN   2742712      11/2005
CN   1972583 A    5/2007
(Continued)

OTHER PUBLICATIONS

First Office Action for Chinese Application No. 201510684652.6, dated Apr. 24, 2017, 6 Pages.

*Primary Examiner* — Daniel Cavallari
*Assistant Examiner* — Rafael Pacheco
(74) *Attorney, Agent, or Firm* — Brooks Kushman P.C.

(57) ABSTRACT

A direct current (DC) link capacitor operable within an electrically drivable vehicle having a high-voltage battery is provided configured to facilitate output of a DC voltage to an inverter configured to process the DC voltage to facilitate powering an electric motor used to drive the vehicle. The DC link capacitor includes a housing enclosing capacitive elements configured to facilitate capacitive processing between an input and an output, at least a first pair of terminals configured to deliver the DC voltage to the input, the capacitive elements processing the DC voltage received at the input into a capacitive DC voltage, and at least a second pair of terminals configured to output the capacitive DC voltage to the inverter, the inverter relying on the capacitive DC voltage to facilitate powering the electric motor.

5 Claims, 3 Drawing Sheets

(51) Int. Cl.
  *H05K 7/20* (2006.01)
  *H02M 7/00* (2006.01)
  *H02M 7/493* (2007.01)
  *H02M 7/48* (2007.01)
(52) U.S. Cl.
  CPC . *H05K 7/20927* (2013.01); *H02M 2007/4822* (2013.01)

(56) References Cited

U.S. PATENT DOCUMENTS

| | | | |
|---|---|---|---|
| 3,660,353 A | 5/1972 | Corman et al. |
| 4,628,407 A | 12/1986 | August et al. |
| 4,670,814 A | 6/1987 | Matsui et al. |
| 4,872,102 A | 10/1989 | Getter |
| 5,091,823 A | 2/1992 | Kanbara et al. |
| 5,239,443 A | 8/1993 | Fahey et al. |
| 5,367,437 A | 11/1994 | Anderson |
| 5,408,209 A | 4/1995 | Tanzer et al. |
| 5,469,124 A | 11/1995 | O'Donnell et al. |
| 5,498,030 A | 3/1996 | Hill et al. |
| 5,504,655 A | 4/1996 | Underwood et al. |
| 5,634,262 A | 6/1997 | O'Donnell et al. |
| 5,740,015 A | 4/1998 | Donegan et al. |
| 5,749,597 A | 5/1998 | Saderholm |
| 5,940,263 A | 8/1999 | Jakoubovitch |
| 5,949,191 A | 9/1999 | Cassese et al. |
| 5,973,923 A | 10/1999 | Jitaru |
| 6,031,751 A | 2/2000 | Janko |
| 6,045,151 A | 4/2000 | Wu |
| 6,087,916 A | 7/2000 | Kutkut et al. |
| 6,144,276 A | 11/2000 | Booth |
| 6,201,701 B1 | 3/2001 | Linden et al. |
| 6,206,466 B1 | 3/2001 | Komatsu |
| 6,222,733 B1 | 4/2001 | Gammenthaler |
| 6,262,891 B1 | 7/2001 | Wickelmaier et al. |
| 6,313,991 B1 | 11/2001 | Nagashima et al. |
| 6,326,761 B1 | 12/2001 | Tareilus |
| 6,386,577 B1 | 5/2002 | Kan et al. |
| 6,430,024 B1 | 8/2002 | Gernert |
| 6,450,528 B1 | 9/2002 | Suezawa et al. |
| 6,466,441 B1 | 10/2002 | Suzuki |
| 6,529,394 B1 | 3/2003 | Joseph et al. |
| 6,819,561 B2 | 11/2004 | Nartzell et al. |
| 6,839,240 B2 | 1/2005 | Skofljanec et al. |
| 6,844,802 B2 | 1/2005 | Drummond et al. |
| 6,943,293 B1 | 9/2005 | Jeter et al. |
| 7,050,305 B2 | 5/2006 | Thorum |
| 7,109,681 B2 | 9/2006 | Baker et al. |
| 7,130,197 B2 | 10/2006 | Chin |
| 7,164,584 B2 | 1/2007 | Walz |
| 7,173,823 B1 | 2/2007 | Rinehart et al. |
| 7,204,299 B2 | 4/2007 | Bhatti et al. |
| 7,212,407 B2 | 5/2007 | Beihoff et al. |
| 7,236,368 B2 | 6/2007 | Maxwell et al. |
| 7,264,045 B2 | 9/2007 | Mehendale et al. |
| 7,289,329 B2 | 10/2007 | Chen et al. |
| 7,295,448 B2 | 11/2007 | Zhu |
| 7,375,287 B2 | 5/2008 | Rathmann |
| 7,375,974 B2 | 5/2008 | Kirigaya |
| 7,471,534 B2 | 12/2008 | Andersson et al. |
| 7,479,020 B2 | 1/2009 | Whitton |
| 7,554,817 B2 | 6/2009 | Nakakita et al. |
| 7,579,805 B2 | 8/2009 | Saito et al. |
| 7,646,606 B2 | 1/2010 | Rytka et al. |
| 7,660,099 B2 | 2/2010 | Imamura et al. |
| 7,710,723 B2 | 5/2010 | Korich et al. |
| 7,726,440 B2 | 6/2010 | Aisenbrey |
| 7,742,303 B2 | 6/2010 | Azuma et al. |
| 7,788,801 B2 | 9/2010 | Oggioni et al. |
| 7,791,887 B2 | 9/2010 | Ganev et al. |
| 7,798,833 B2 | 9/2010 | Holbrook |
| 7,800,257 B2 | 9/2010 | Lu |
| 7,804,688 B2 | 9/2010 | Wakabayashi et al. |
| 7,864,506 B2 | 1/2011 | Pal et al. |
| 7,869,714 B2 | 1/2011 | Patel et al. |
| 7,907,385 B2 | 3/2011 | Korich et al. |
| 7,920,039 B2 | 4/2011 | Shabany et al. |
| 7,952,225 B2 | 5/2011 | Reichard et al. |
| 7,952,876 B2 | 5/2011 | Azuma et al. |
| 7,957,166 B2 | 6/2011 | Schnetzka et al. |
| 7,974,101 B2 | 7/2011 | Azuma et al. |
| 8,040,005 B2 | 10/2011 | Bhatti |
| 8,064,198 B2 | 11/2011 | Higashidani et al. |
| 8,064,234 B2 | 11/2011 | Tokuyama et al. |
| 8,072,758 B2 | 12/2011 | Groppo et al. |
| 8,098,479 B1 | 1/2012 | Parler, Jr. et al. |
| 8,110,415 B2 | 2/2012 | Knickerbocker et al. |
| 8,169,780 B2 | 5/2012 | Yoshino et al. |
| 8,376,069 B2 | 2/2013 | Nakatsu et al. |
| 8,416,574 B2 | 4/2013 | Tokuyama et al. |
| 8,422,230 B2 | 4/2013 | Aiba et al. |
| 8,582,291 B2 | 11/2013 | Nakasaka et al. |
| 8,582,294 B2 | 11/2013 | Guerin et al. |
| 8,654,527 B2 | 2/2014 | Wei et al. |
| 8,665,596 B2 | 3/2014 | Brereton |
| 8,675,364 B2 | 3/2014 | Tokuyama et al. |
| 2002/0106414 A1 | 8/2002 | Gernert |
| 2002/0130495 A1 | 9/2002 | Lotspih et al. |
| 2003/0053298 A1 | 3/2003 | Yamada et al. |
| 2005/0263273 A1 | 12/2005 | Crumly |
| 2007/0109715 A1* | 5/2007 | Azuma ............... B60K 6/28 361/299.3 |
| 2007/0240867 A1 | 10/2007 | Amano et al. |
| 2007/0246191 A1 | 10/2007 | Behrens et al. |
| 2008/0117602 A1 | 5/2008 | Korich et al. |
| 2010/0078807 A1 | 4/2010 | Schulz |
| 2010/0081191 A1 | 4/2010 | Woods |
| 2010/0157640 A1 | 6/2010 | Azuma et al. |
| 2010/0254093 A1 | 10/2010 | Oota et al. |
| 2010/0328883 A1 | 12/2010 | Ledezma et al. |
| 2010/0328893 A1 | 12/2010 | Higashidani et al. |
| 2011/0116235 A1 | 5/2011 | Ryu et al. |
| 2011/0214629 A1 | 9/2011 | Benoit |
| 2011/0222240 A1 | 9/2011 | Kawata et al. |
| 2011/0235276 A1 | 9/2011 | Hentschel et al. |
| 2011/0267778 A1 | 11/2011 | Eckstein et al. |
| 2012/0031598 A1 | 2/2012 | Han et al. |
| 2012/0206950 A1 | 8/2012 | Duppong et al. |
| 2012/0235290 A1 | 9/2012 | Morelle et al. |
| 2013/0039009 A1 | 2/2013 | Shin et al. |
| 2013/0044434 A1 | 2/2013 | Sharaf et al. |
| 2013/0170269 A1 | 7/2013 | Sharaf et al. |
| 2013/0215573 A1 | 8/2013 | Wagner et al. |
| 2013/0223009 A1 | 8/2013 | Nakatsu et al. |
| 2013/0258596 A1 | 10/2013 | Sharaf et al. |
| 2014/0069615 A1 | 3/2014 | Kusaka |

FOREIGN PATENT DOCUMENTS

| | | |
|---|---|---|
| CN | 101606210 | 12/2009 |
| CN | 101981638 | 2/2011 |
| CN | 102013319 | 4/2011 |
| DE | 102007054618 A1 | 6/2008 |
| DE | 102008033473 A1 | 5/2009 |
| EP | 1028439 | 8/2000 |
| EP | 1484774 | 12/2004 |
| FR | 2903057 | 1/2008 |
| JP | 4256397 | 9/1992 |
| JP | 07297043 | 11/1995 |
| JP | 200454358 A | 9/2004 |
| JP | 2007273774 | 10/2007 |
| JP | 2008078350 | 4/2008 |
| JP | 2008085168 | 4/2008 |
| JP | 2011182500 A | 9/2011 |
| WO | 2010144399 | 12/2010 |
| WO | 2011138156 | 11/2011 |

\* cited by examiner

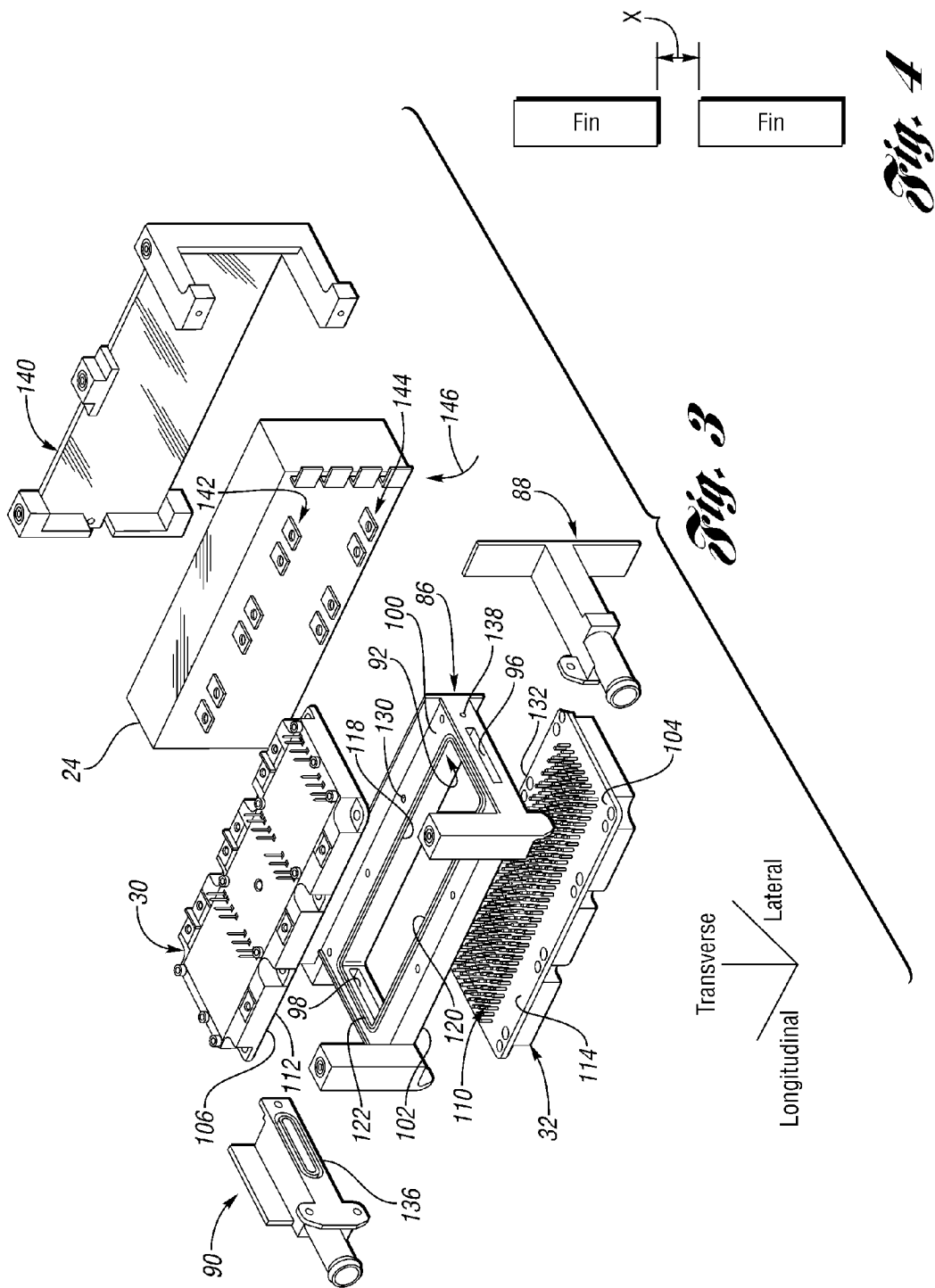

POWER MODULE COOLING SYSTEM

CROSS-REFERENCE TO RELATED APPLICATIONS

This application is a divisional of co-pending U.S. patent application Ser. No. 13/209,552 filed on Aug. 15, 2011, the disclosure of which is incorporated in its entirety by reference herein.

TECHNICAL FIELD

The present disclosure relates to power module cooling systems, such as but not limited to cooling systems operable with power modules configured to facilitate driving an electric motor with output from a DC/AC inverter.

BACKGROUND

Power modules may be used for any number of electronic applications where current and/or voltage manipulation is desired. Power modules, in particularly those operable to support relatively high current and voltage requirements, may generate significant amounts of heat during operation. Because the heat can negatively influence performance, it may be desirable to facilitate cooling of the power module. Accordingly, the present disclosure desires to provide a cooling system operable to facilitate the cooling of power modules.

SUMMARY

One non-limiting aspect of the present disclosure contemplates a power module cooling system comprising: a first power module having a first plurality of cooling fins; a second power module having a second plurality of cooling fins; a cold plate having a top side shaped to receive the first power module and a bottom side shaped to receive the second power module, the top side and the bottom side being spaced apart to define a fluid passageway into which the first and second plurality of cooling fins extend, the fluid passage extending between first and second apertures included within respective first and second lateral sides of the cold plate, the first aperture directing received fluid through the fluid passageway to the second aperture to facilitate cooling of the first and second plurality of cooling fins.

One non-limiting aspect of the present disclosure contemplates a first power module seal around an entire perimeter of a top side of the fluid passageway between the cold plate and the first power module and a second power module seal around an entire perimeter of a bottom side of the fluid passageway between the cold plate and the second power module, the first and second power module seals being operable to prevent fluid from leaking out of the fluid passageway.

One non-limiting aspect of the present disclosure contemplates a plurality of fastener apertures within the top side and the bottom side of the cold plate outboard of the fluid passageway and the first and second power module seals, the plurality of fastener apertures aligning with corresponding fastener apertures of the first and second power modules through which fasteners extend to secure the first power module and the second power module to the top side and the bottom side of the cold plate.

One non-limiting aspect of the present disclosure contemplates the fasteners apertures are operable with the fasteners to facilitate compressing the first power module against the first power module seal and the second power module against the second power module seal.

One non-limiting aspect of the present disclosure contemplates a first cooling manifold operable to exchange fluid with the first aperture and a second cooling manifold operable to exchange fluid with the second aperture.

One non-limiting aspect of the present disclosure contemplates a first manifold seal around an entire perimeter of the first aperture between the cold plate and the first manifold and a second manifold seal around an entire perimeter of the second aperture between the cold plate and the second manifold, the first and second manifold seals being operable to prevent fluid from leaking out of the fluid passageway.

One non-limiting aspect of the present disclosure contemplates a plurality of fastener apertures within the first and second lateral sides of the cold plate, the plurality of fastener apertures aligning with corresponding fastener apertures of the first and second power manifolds through which fasteners extend to secure the first manifold and the second manifold to the first and second lateral sides of the cold plate.

One non-limiting aspect of the present disclosure contemplates a capacitor having a height greater than a combined height of the first and second power modules and a width greater than the first power module, the capacitor having at least a first plurality of capacitor terminals connected to the first power module and a second plurality of capacitor terminals connected to the second power module.

One non-limiting aspect of the present disclosure contemplates a clamp bracket used to position the capacitor relative to the first and second power modules being fastened to at least two of the cold plate, the first cooling manifold, and the second coolant manifold, the clamp bracket aligning the first and second capacitor terminals with corresponding terminals of the first and second power modules.

One non-limiting aspect of the present disclosure contemplates the clamp bracket is not fastened to the capacitor.

One non-limiting aspect of the present disclosure contemplates the clamp bracket fastens to both of the cold plate and the first coolant manifold, wherein the second coolant manifold is shaped differently from the first coolant manifold such that the second manifold cannot be fastened to the clamp bracket.

One non-limiting aspect of the present disclosure contemplates outboard ends of the first plurality of fins are position no more than 1 mm from outboard ends of the second plurality of fins.

One non-limiting aspect of the present disclosure contemplates outboard ends of the first plurality of fins are positioned no closer than 0.1 mm from outboard ends of the second plurality of fins.

One non-limiting aspect of the present disclosure contemplates a cooling system for use with a DC/AC inverter, the DC/AC inverter having a first power module comprised at least of a plurality of first switches controlled with a first driver and a physically separate second power module comprised at least of a plurality of second switches controlled with a second driver, wherein each one of the plurality of first switches is electrically connected in parallel with at least a corresponding one of the plurality of second switches, each of the first and second power modules including a plurality of outwardly extending cooling fins, the cooling system comprising: a cold plate having a fluid passageway through which a cooling fluid flows in a longitudinal direction, the cold plate being configured to position the cooling fins of the first and second power modules in an opposing relationship within the fluid passageway to be cooled by the cooling fluid.

One non-limiting aspect of the present disclosure contemplates the opposing relationship is characterized by an outboard end of each cooling fin of the first power module being positioned no more than 1.0 mm from an outboard end of a correspondingly opposed one of the cooling fins of the second power module.

One non-limiting aspect of the present disclosure contemplates the cold plate includes opposed top and bottom apertures extending longitudinally across substantially the entire longitudinal direction, the cooling fins of the first and second power modules respectively extending through the opposed top and bottom apertures.

One non-limiting aspect of the present disclosure contemplates the cold plate includes opposed left and right apertures at correspondingly opposed longitudinal ends, the left and right apertures being transverse to the top and bottom apertures, the right aperture receiving the cooling fluid and the left aperture expelling the cooling fluid, wherein the left and right apertures are smaller than the top and bottom apertures.

One non-limiting aspect of the present disclosure contemplates cooling system further comprising: a left manifold configured to exchange the cooling fluid with the left aperture; a right manifold configured to exchange the cooling fluid with the right aperture; a capacitor having a first set of terminals electrically and mechanically connected to the first power module, a second set of terminals electrically and mechanically connected to the second power module, and a third set at terminals electrically and mechanically connected to an EMI filter; and a clamp bracket configured to secure the capacitor relative to the first and second module and the cold plate, the clamp bracket fastening at one portion to the cold plate and at another portion to the coolant manifold.

One non-limiting aspect of the present disclosure contemplates a cooling system wherein a height of the cold plate measured transversely to the longitudinal direction is less than a width of the cold plate measured in the longitudinal direction, and wherein a depth of the cold plate measured laterally to the longitudinal direction is greater than the height and less than the width.

One non-limiting aspect of the present disclosure contemplates a three-phase DC/AC inverter comprising: a first power module having a first plurality of switches operable to invert a DC input to a three-phase AC output and a first plurality of cooling fins; a separate second power module having a second plurality of switches matching the first plurality of switches and connected in parallel therewith, the second power module including a second plurality of cooling fins; and a cold plate having a fluid passageway through which a cooling fluid flows in a longitudinal direction, the first plurality of cooling fins being positioned by the cold plate in an opposing manner to the second plurality of cooling fins to be cooled by the cooling fluid.

One non-limiting aspect of the present disclosure contemplates a direct current (DC) link capacitor operable within an electrically drivable vehicle having a high-voltage battery configured to facilitate output of a DC voltage to an inverter configured to process the DC voltage to facilitate powering an electric motor used to drive the vehicle. The DC link capacitor may comprise a housing enclosing capacitive elements configured to facilitate capacitive processing between an input and an output, at least a first pair of terminals configured to deliver the DC voltage to the input, the capacitive elements processing the DC voltage received at the input into a capacitive DC voltage, and at least a second pair of terminals configured to output the capacitive DC voltage to the inverter, the inverter relying on the capacitive DC voltage to facilitate powering the electric motor. The DC link capacitor may further comprise at least a third pair of terminals configured to deliver the DC voltage to the input. The DC link capacitor may further comprise at least a fourth pair of terminals configured to output the capacitive DC voltage to the inverter. According to one non-limiting aspect of the DC link capacitor, the DC voltage may be received from an electromagnetic interference EMI filter and the inverter may comprise a first power module and a second power module, each of the first and second power modules providing a DC/AC conversion that is combined to facilitate powering the electric motor. The first and third pairs of terminals may be configured to electrically and mechanically connect with the EMI filter, and the second and fourth pairs of terminals may be configured to electrically and mechanically connect with the first and second power modules. The housing may have a height greater than a combined height of the first and second power modules and a width greater than the first power module.

BRIEF DESCRIPTION OF THE DRAWINGS

The present disclosure is pointed out with particularity in the appended claims. However, other features of the present disclosure will become more apparent and the present disclosure will be best understood by referring to the following detailed description in conjunction with the accompany drawings in which:

FIG. 3 illustrates an assembly view of the power module cooling system as contemplated by one non-limiting aspect of the present disclosure; and FIG. 4 illustrates cooling fins in an opposing relationship as contemplated by one non-limiting aspect of the present disclosure.

DETAILED DESCRIPTION

As required, detailed embodiments are disclosed herein. However, it is to be understood that the disclosed embodiments are merely exemplary of the disclosure that may be embodied in various and alternative forms. The figures are not necessarily to scale. Some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
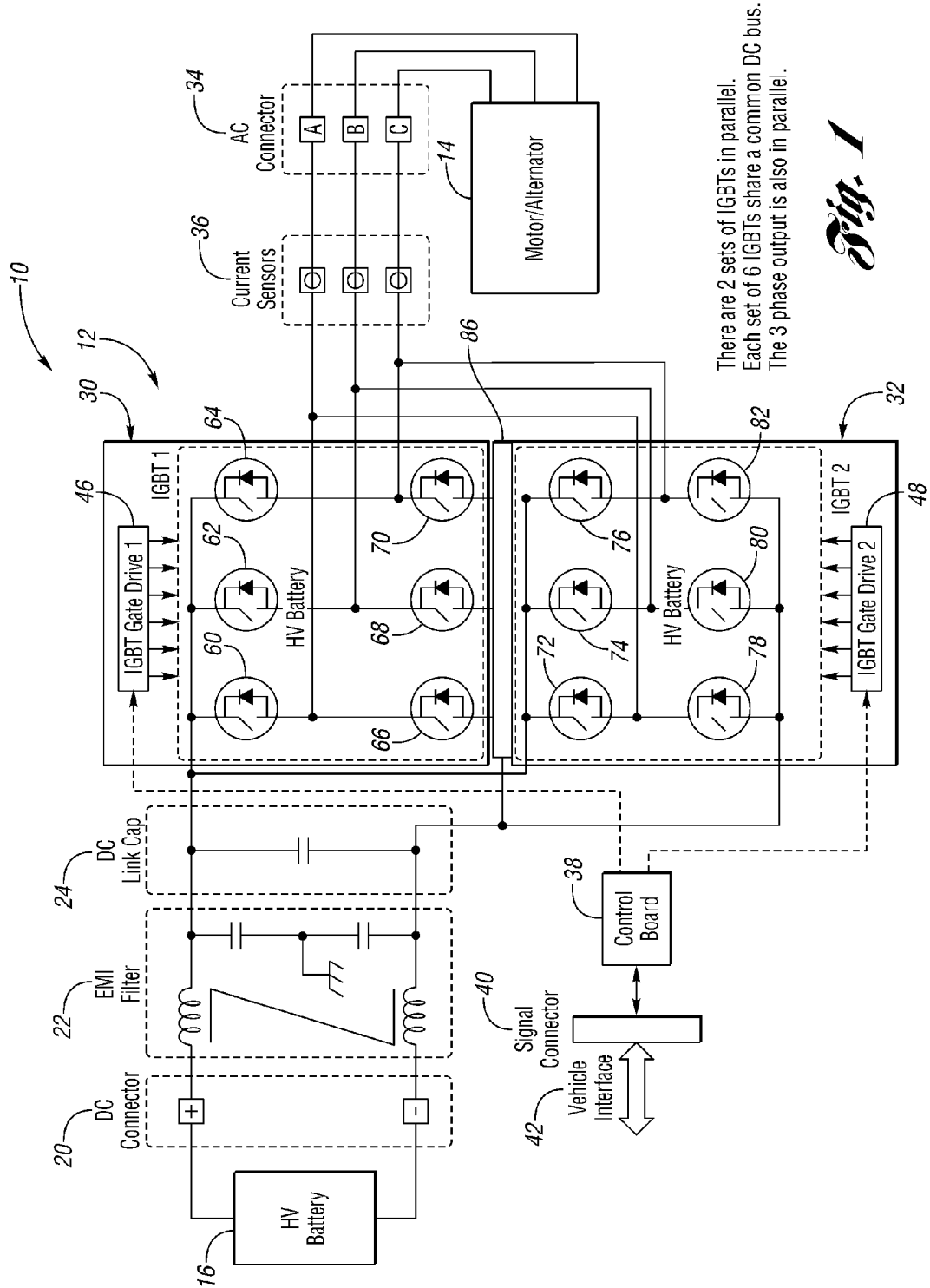
FIG. 1 schematically illustrates a power module system as contemplated by one non-limiting aspect of the present disclosure.

FIG. 1 schematically illustrates a power module system 10 having a power module cooling system 12 as contemplated by one non-limiting aspect of the present disclosure. The power module system 10 is shown for exemplary and non-limiting purposes as being configured to facilitate AC powering of an electric motor and/or alternator 14 included within a vehicle (not shown) with DC energy supply from a high voltage (HV) battery 16 also included within the vehicle. The power module system 10 may include a DC connector 20 operable between an open and a closed position to facilitate connecting and disconnecting the HV battery 16 to an electromagnetic interference (EMI) filter 22. A DC link capacitor 24 may connected to the EMI filter 22 to further filter the DC output from the HV battery 16. The DC output of the capacitor 24 may be commonly provided to a first power module 30 connected in parallel with a second power module 32. The first and second power modules 30, 32 may be configured to facilitate DC/AC inversion of the DC output into an AC output sufficient for powering the motor/alternator 14.

The power module system 10 may include an AC connector system 34 to facilitate connecting the AC output to the motor/alternator. A current sensing system 36 may be included to facilitate sensing current provided to the motor/alternator 14, such as to facilitate control of the DC/AC inversion process. A control board 38 may include a signal connector 40 to a vehicle interface 42 of a vehicle bus (not shown). The control board 38 may receive feedback from the current sensors 36 and other devices/systems within the vehicle to facilitate controlling or directing the DC/AC inversion process. The control board 38 may cooperate with a first driver 46 configured to control the first power module 30 and a second driver 48 configured to control the second power module. The first and second drivers 46, 48 may be configured to respectively control a plurality of first and second switches included within each module 30, 32 such that the opening and closing of the switches 60, 62, 64, 66, 68, 70, 72, 74, 76, 78, 80, 82 can be coordinated to provide the desired AC output to the motor/alternator 14.

The first and second power modules 30, 32 are shown to be configured as insulated-gate bipolar transistors (IGBTs) for exemplary non-limiting purposes. The present disclosure, however, is unnecessary limited to this particular configuration or the use of these components. The present disclosure fully contemplates its use and application to virtually any type of power module system, including those in it may not rely upon switches and/or those that may be operable within non-vehicle-based systems. The exemplary description provided herein, however, is believed to be particularly beneficial in that it contemplates a particular configuration for electrically connecting the power modules 30, 32 in parallel to facilitate the DC/AC inversion process and cooling the first and second power modules 30, 32 with a cold plate 86 such that a packaging size of the power module system 10, or at least a portion of the power module system components, may be minimized without unduly sacrificing cooling capabilities.

Figure 2:
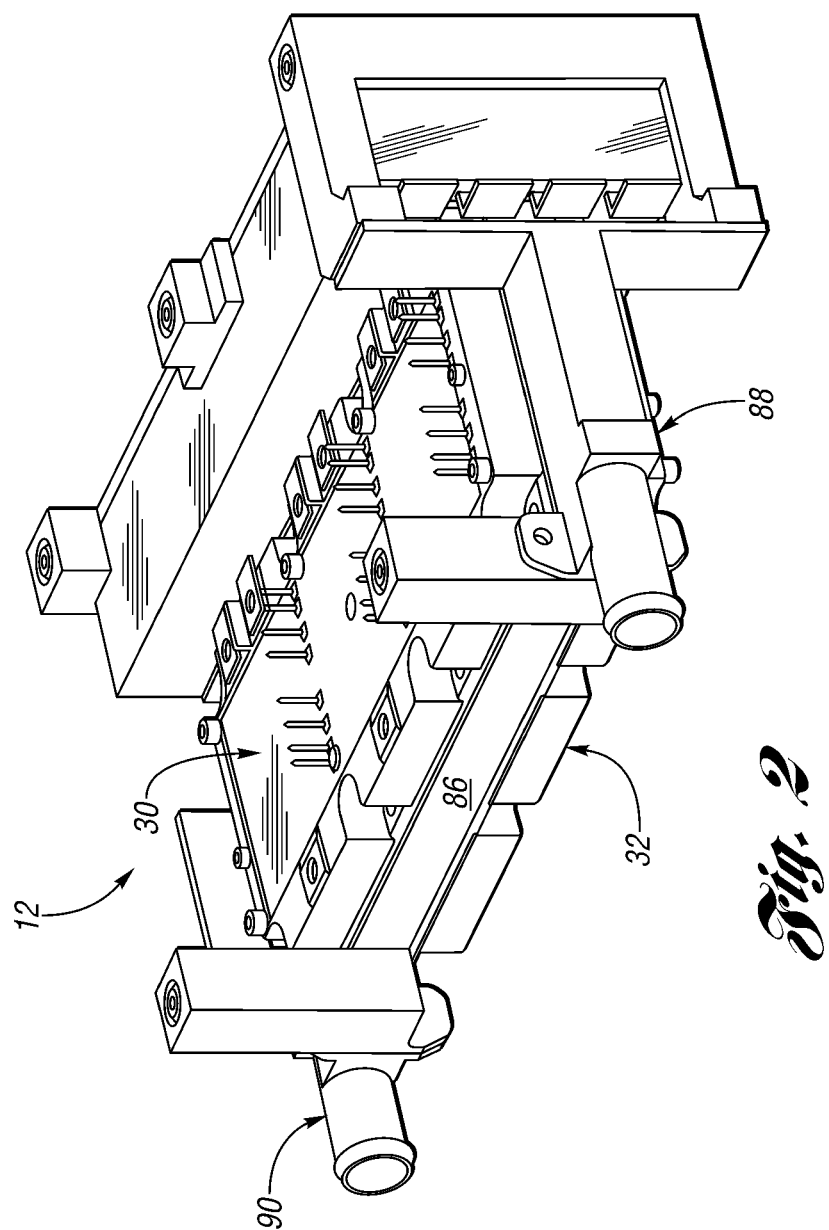
FIG. 2 illustrates a power module cooling system as contemplated by one non-limiting aspect of the present disclosure.

The cold plate 86 is shown schematically in FIG. 1 to be generally positioned between the first and second power modules 30, 32. FIG. 2 illustrates the cold plate 86 in more detail and as configured as part of the power module cooling system 12 contemplated by one non-limiting aspect of the present disclosure. The cooling system 12 is shown to include a first coolant manifold 88 and a second manifold 90 configured to facilitate a coolant flow through a fluid passageway 92 included within the cold plate 86. FIG. 3 illustrates the power module cooling system 12 in more detail, and in particular, the fluid passage 92 through the cold plate 86, as contemplated by one non-limiting aspect of the present disclosure. A coolant fluid may be received at the first coolant manifold 88 and expelled from the second coolant manifold 90 such that the cooling fluid flows in a longitudinal direction through the cold plate 86 between corresponding first and second apertures 96, 98. The coolant fluid may comprise any suitable liquid, plasma, or gas having characteristic sufficient to facilitate cooling the first and second power modules 30, 32.

The first power module 30 may be received within a top side 100 of the cold plate 86 and the second power module 32 may be received within a matching bottom side 102 of the cold plate 86. The first power module 30 and the second power module 32 may be arranged in an opposing manner such that a bottom side 104, 106 of each is directed towards the other. The bottom side 104, 106 of each power module 30, 32 may include a plurality of cooling fins (only the second power module 32 Figures are shown and generally referred to with reference numeral 110). The cooling fins 110 may be metallic or other thermally conducting material. The cooling fins 110 may extend outwardly away from a first printed circuit board (PCB) 112 and second PCB 114 respectively associated with the first and second power modules 30, 32. The cooling fins 110 may be positioned in a diametrically opposed manner through corresponding top and bottom longitudinal openings 118, 120 in the cold plate 86. The cooling fins 110 may be positioned in this opposed manner so that a volume of the fluid flow passageway is minimized while still allowing both power modules 30, 32 to be cooled. While the power modules 30, 32 are shown to include a relatively large number of discrete cooling fins 110 shaped as blade terminals, the use of the fins 110 may be omitted entirely and/or the fins 110 may be shaped as larger components or in other configurations suitable to facilitate interactions with the coolant flow.

The cooling of the power modules 30, 32 through the cooling fins 110 may be maximized by maximizing the amount of fluid flowing contacting the cooling fins 110. This may be achieved by maximizing interference between the cooling fins 110 in the coolant flow. Optionally, the cooling fins 110 of the first power module 30 may be positioned at a distance X of no more than 1.0 mm from the cooling fins of the second power module, to maximize interference with the coolant flow as shown in FIG. 4. More preferably, to ensure the cooling fins 110 provide maximum interference with the coolant flow, the cooling fins of the first power module 30 may be positioned within 0.5 mm of the cooling fins 110 of the second power module 32. It may be desirable to maintain at least a 0.1 mm distance X between the opposed cooling fins 110 in order to ensure at least some coolant fluid is able to pass from the first coolant manifold 88 to the second coolant manifold 90 to a desired velocity, i.e., the velocity of coolant flow may be proportional to the distance X between the opposed cooling fins.

A volume of the coolant passageway 92 may be approximately equal to a width of the cold plate 86 measured in the longitudinal direction between the first and second aperture 96, 98 multiplied by a depth of the cold plate 86 measured in the lateral direction between ends of the first aperture 96 multiplied by a height of the cold plate 86 measured in the transverse direction corresponding with a thickness of the cold plate 86 equal to a separation between the top and bottom sides. The height of the coolant passageway 92 may optionally be less than a height of the first power module 30 such that the volume of the coolant passageway 92 is less than a volume comprising one of the first and second power modules 30, 32. In this manner, a coolant passage 92 having a volume somewhat less than the volume of one of the first and second power modules 30, 32 may be sufficient to facilitate simultaneously cooling both of first and second power modules 30, 32. The ability to cool multiple power modules 30, 32 with a fluid passageway 92 of minimal size may be beneficial in limiting the size and packaging requirements for the power module cooling system 12, which can be particularly beneficial when used within a vehicle.

The cold plate 86 may include a top seal 122 and a matching bottom seal (not shown) positioned around an entire outer perimeter of the respective top and bottom, longitudinal apertures 118, 120. The seals 122 may cooperate with the PCBs 112, 114 of the first and second power modules 30, 32 to facilitate sealing the coolant passageway 92. The cold plate may include apertures 130 (only one labeled) outboard of the seals 122 that align with apertures 132 (only one labeled) of the first and second power modules 30, 32. Fasteners (not shown) may be inserted through the apertures 130, 132 to press the first and second power module 30, 32 against the cold plate 86, and thereby, the top and bottom seals 122 to facilitate the sealing effects. Additional seals 136 (only left shown) may be included around the entire outer perimeter of the first and second apertures 96, 98 to facilitate a sealing arrangement with the respective first and second coolant manifolds 88, 90. Additional apertures 138 (only one shown) may be included to facilitate fastening the coolant manifolds to the cold plate to establish the sealing arrangement around the first and second apertures.

The capacitor 24 may be positioned relative to a back side of the cold plate 86 with a clamp bracket 140. The capacitor 24 may include a first row 142 and a second row 144 of a plurality of terminals for establishing the electrical connections with the corresponding first and second power modules 30, 32, such as to provide the electrical connections shown in shown in FIG. 1. The capacitor 24 may include a third row 146 of a plurality of terminals for establishing electrical connections with the EMI filter 22 (the top two terminals may establish the positive connection to the EMI filter 22 and the bottom two terminals may establish the negative connection to the EMI filter 22). The clamp bracket 140 may be configured to facilitate positioning the capacitor 24 relative to the power modules 30, 32 and the cold plate 86 such that the capacitor 24 is not directly fastened to either one of the power modules 30, 32 or the cold plate 86, other than by soldering or other electrical plus mechanical means used to connect to reporter terminals 142, 144. This arrangement may be beneficial in permitting the use of an off-the-shelf capacitor or without having to include recesses or other fastening points within the capacitor.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A direct current (DC) link capacitor operable within an electrically drivable vehicle having a high-voltage battery configured to facilitate output of a DC voltage to an inverter configured to process the DC voltage to facilitate powering an electric motor used to drive the vehicle, the DC link capacitor comprising:
    a housing enclosing capacitive elements configured to facilitate capacitive processing between an input and an output;
    at least a first pair of terminals configured to deliver the DC voltage to the input, the capacitive elements processing the DC voltage received at the input into a capacitive DC voltage; and
    at least a second pair of terminals configured to output the capacitive DC voltage to the inverter, the inverter relying on the capacitive DC voltage to facilitate powering the electric motor;
    wherein the housing, the at least a first pair of terminals, and the at least a second pair of terminals are configured to cooperate with a clamp bracket and a cold plate, the DC link capacitor being disposed between the clamp bracket and the cold plate, the clamp bracket for positioning the DC link capacitor relative to the cold plate and the cold plate for cooling the inverter.

2. The DC link capacitor of claim 1 further comprising at least a third pair of terminals configured to deliver the DC voltage to the input.

3. The DC link capacitor of claim 2 further comprising at least a fourth pair of terminals configured to output the capacitive DC voltage to the inverter.

4. The DC link capacitor of claim 3:
    wherein the DC voltage is received from an electromagnetic interference EMI filter and the inverter comprises a first power module and a second power module, each of the first and second power modules providing a DC/AC conversion that is combined to facilitate powering the electric motor;
    wherein the first and third pairs of terminals are configured to electrically and mechanically connect with the EMI filter; and
    wherein the second and fourth pairs of terminals are configured to electrically and mechanically connect with the first and second power modules.

5. The DC link capacitor of claim 4 wherein the housing has a height greater than a combined height of the first and second power modules and a width greater than the first power module.

* * * * *